(12) United States Patent
Matsukawa

(10) Patent No.: US 8,069,815 B2
(45) Date of Patent: Dec. 6, 2011

(54) RESIST PIPE AND RESIST COATING DEVICE

(75) Inventor: Yoshihiko Matsukawa, Miyazaki (JP)

(73) Assignee: Lapis Semiconductor Co., Ltd. (JP)

( * ) Notice: Subject to any disclaimer, the term of this patent is extended or adjusted under 35 U.S.C. 154(b) by 658 days.

(21) Appl. No.: 12/076,384

(22) Filed: Mar. 18, 2008

(65) Prior Publication Data

US 2008/0251013 A1 Oct. 16, 2008

(30) Foreign Application Priority Data

Apr. 16, 2007 (JP) ................................ 2007-107050

(51) Int. Cl.
*B05C 11/00* (2006.01)
*B05C 11/02* (2006.01)

(52) U.S. Cl. .......... 118/693; 118/694; 118/52; 118/612; 118/712; 73/290 R

(58) Field of Classification Search .................. 118/693, 118/694, 52, 56, 612, 319, 320, 712, 713; 396/604, 611, 627; 134/153, 198, 902; 73/290 R, 73/290 V See application file for complete search history.

(56) References Cited

U.S. PATENT DOCUMENTS 5,656,774 A * 8/1997 Nelson et al. ............... 73/290 V

FOREIGN PATENT DOCUMENTS

| JP | 8-219853 | 8/1996 |
| JP | 9-021677 | 1/1997 |
| JP | 2000-084468 | 3/2000 |
| JP | 2005-136186 | 5/2005 |

* cited by examiner

*Primary Examiner* — Yewebdar Tadesse

(74) *Attorney, Agent, or Firm* — Rabin & Berdo, PC

(57) ABSTRACT

A resist pipe and a resist coating device are provided. Support portions are provided at an inner wall of a resist supply portion towards a cross-sectional center of the resist supply portion from three locations. The support portions are provided at equal intervals at the inner wall, and the leading ends thereof extend to positions at which a circular rod-shaped liquid level sensor portion is nipped by a peripheral surface of the liquid level sensor portion. In this manner, the support portions support the liquid level sensor portion from three directions, and gaps are formed between the liquid level sensor portion and the inner wall of the resist supply portion. The liquid level sensor portion inside the resist supply portion is supported by the support portions such that a sensing portion is substantially in the same plane as an inlet aperture of the resist supply portion.

8 Claims, 9 Drawing Sheets

SECTION Z-Z

FIG. 5B (B-1)

SECTION Y-Y
(B-2)

(C-1)   (C-2)   (C-3)

RESIST PIPE AND RESIST COATING DEVICE

CROSS-REFERENCE TO RELATED APPLICATION

This application claims priority under 35 USC 119 from Japanese Patent Application No. 2007-107050, the disclosure of which is incorporated by reference herein.

BACKGROUND

1. Technical Field

The present invention relates to a resist pipe and a resist coating device, and more specifically relates to a resist pipe of a resist coating device that is employed in a lithography process in fabrication of an integrated circuit, and relates to that resist coating device.

2. Related Art

Heretofore, in a process of fabrication of a semiconductor device, that is, an integrated circuit such as an IC, an LSI, a ULSI or the like, generally, a photolithography technology has been used to implement formation of a predetermined pattern on a substrate to be processed, which is, for example, a semiconductor substrate (such as a silicon wafer) (see, for example, Japanese Patent Application Laid-Open (JP-A) No. 2000-84468).

In this photolithography technology, a resist film is coated to a main surface of the semiconductor substrate. A resist coating device is used for the coating of the resist film. Commonly, a spin-coating method is used in the coating of the resist film by the resist coating device. That is, the semiconductor substrate is loaded on a spin chuck, the resist coating device is used to drip resist liquid to a central portion of the semiconductor substrate, after which the spin chuck is rotated at high speed. The resist liquid is spread from the central portion to a peripheral portion of the semiconductor substrate by centrifugal force caused by the rapid rotation of the semiconductor substrate, and the resist film is coated uniformly to the overall surface of the semiconductor substrate.

As shown in FIG. 7, a resist supply portion 120, which supplies the resist liquid to the resist coating device, is provided with, for example, a liquid level sensor portion 130 as described in JP-A No. 8-219853. When a remaining amount of a resist liquid 116 in a gallon bottle 114 falls, it is detected by the liquid level sensor portion 130, and an inhalation of air by the resist supply portion 120 due to the falling of a liquid level 116A is prevented. The liquid level sensor portion 130 and the resist supply portion 120 are inserted into the gallon bottle 114 or the like respectively separately.

As shown in FIG. 8A and FIG. 8B, when the falling of the liquid level of the resist liquid 116 is not detected by the liquid level sensor portion 130 and that air is inhaled by the resist supply portion 120, it is possible that a proper resist dripping amount may not be provided due to the mixing in of air in the resist coating process, and coating failures occur. Structures for eliminating air bubbles that have been mixed into the resist have been proposed (see, for example, JP-A No. 2005-136186), but are not capable of preventing mixing of air into the liquid.

Moreover, as shown in FIG. 8C and FIG. 8D, when the liquid level sensor portion 130 mistakenly detects the liquid level 116A even when an amount remains (misdetection), there is no effect on the product. However, problems remain such as a reduction in efficiency and an increase in man-hours due to operations being interrupted, the impossibility of detecting when the liquid amount will actually fall, and so forth.

The above-described problems are caused by positions of the leading end of the resist supply portion and the liquid level sensor portion being separated. Therefore, to solve these problems, it is necessary to close up the two.

SUMMARY

Accordingly, the present invention provides a resist pipe and a resist coating device wherein a liquid level sensor portion is disposed inside a resist supply portion and it is possible to prevent air mixing into the resist, liquid level misdetections and the like.

A resist pipe of a first aspect of the present invention includes: a resist supply portion inserted into a container accommodating a resist liquid and configured to draw in the resist liquid; and support portions provided at an inner wall of the resist supply portion, supporting a peripheral surface of a rod-shaped liquid level sensor portion from at least three directions, and setting a sensing portion at a leading end of the liquid level sensor portion in substantially the same plane as an inlet aperture of the resist supply portion.

According to the first aspect described above, the sensing portion, which is the leading end of the liquid level sensor portion, can be constantly retained in the same plane as the inlet aperture at the leading end of the resist supply portion, and the sensing portion is constantly disposed in the inlet aperture. Consequently, air mixing into the resist and liquid level misdetections can be prevented.

A resist pipe of a second aspect includes: a resist supply portion inserted into a container accommodating a resist liquid and configured to draw in the resist liquid; a cylindrical joint provided at an inlet aperture of the resist supply portion and covering a rod-shaped liquid level sensor portion; and support portions provided at an inner wall of the joint, supporting a peripheral surface of the liquid level sensor portion from at least three directions, such that a sensing portion at a leading end of the liquid level sensor portion is substantially in the same plane as an inlet aperture of the joint.

According to the second aspect, the sensing portion which is the leading end of the liquid level sensor portion can be constantly retained at the same position as the inlet aperture of the joint provided at the leading end of the resist supply portion. Therefore, air mixing into the resist and liquid level misdetections can be prevented. Moreover, machining costs of the supply pipe can be reduced.

A resist pipe of a third aspect includes: a resist supply portion inserted into a container accommodating a resist liquid and configured to draw in the resist liquid; and a liquid level sensor portion, having a peripheral surface supported from at least three directions by an inner wall of the resist supply portion, wherein a sensing portion provided at a leading end of the liquid level sensor portion is set in substantially the same plane as an inlet aperture of the resist supply portion.

According to the third aspect, the sensing portion which is the leading end of the liquid level sensor portion can be constantly retained in the same plane as the inlet aperture at the leading end of the resist supply portion, and the sensing portion is constantly disposed in the inlet aperture. Therefore air mixing into the resist and liquid level misdetections can be prevented.

A resist pipe of a fourth aspect includes: a resist supply portion inserted into a container accommodating a resist liquid and configured to draw in the resist liquid; and support portions provided at an inner wall of the resist supply portion, supporting a peripheral surface of a rod-shaped liquid level sensor portion from at least three directions, such that a sensing portion at a leading end of the liquid level sensor portion is at a position recessed into an inlet aperture of the resist supply portion.

According to the fourth aspect, the sensing portion which is the leading end of the liquid level sensor portion can be retained at a position recessed into the inlet aperture at the leading end of the resist supply portion, and the sensing portion is constantly disposed in the inlet aperture. Therefore, air mixing into the resist and liquid level misdetections can be prevented.

A resist pipe of a fifth aspect includes: a resist supply portion inserted into a container accommodating a resist liquid and configured to draw in the resist liquid; a cylindrical joint provided at an inlet aperture of the resist supply portion and covering a rod-shaped liquid level sensor portion; and support portions provided at an inner wall of the joint, supporting a peripheral surface of the liquid level sensor portion from at least three directions, such that a sensing portion at a leading end of the liquid level sensor portion is at a position recessed into an inlet aperture of the joint.

According to the fifth aspect, the sensing portion which is the leading end of the liquid level sensor portion can be retained at a position recessed into the inlet aperture at the leading end of the joint provided at the leading end of the resist supply portion. Therefore, air mixing into the resist and liquid level misdetections can be prevented. Further, machining costs of supply pipe can be reduced.

A resist pipe of a sixth aspect includes a resist supply portion inserted into a container accommodating a resist liquid and configured to draw in the resist liquid; and a liquid level sensor portion having a peripheral surface supported from at least three directions by an inner wall of the resist supply portion, wherein a sensing portion at a leading end of the liquid level sensor portion is at a position recessed into an inlet aperture of the resist supply portion.

According to the sixth aspect, the sensing portion which is the leading end of the liquid level sensor portion can be retained at a position recessed into the inlet aperture at the leading end of the resist supply portion, and the sensing portion is constantly disposed in the inlet aperture. Therefore, air mixing into the resist and liquid level misdetections can be prevented.

A resist pipe of a seventh aspect is characterized that the sensing portion is disposed at a position recessed into the inlet aperture by a distance of less than an internal diameter of the inlet aperture.

According to the seventh aspect, the sensing portion which is the leading end of the liquid level sensor portion can be retained at a position recessed into the inlet aperture at the leading end of the resist supply portion, and the sensing portion is constantly disposed in the inlet aperture, air mixing into the resist and liquid level misdetections can be prevented.

A resist pipe of an eighth aspect is characterized that the support portions are provided at equal intervals at the inner wall of the resist supply portion, and gaps are formed between the liquid level sensor portion and the inner wall of the resist supply portion so as to ensure a space for the resist liquid to pass through.

A resist pipe of a ninth aspect is characterized that the joint is provided with a female threaded portion which screws together with a male threaded portion provided at a leading end of the resist supply portion.

A resist coating device of a tenth aspect includes the resist pipe of any one of the first to the ninth aspects.

According to the tenth aspect, the sensing portion which is the leading end of the liquid level sensor portion can be constantly retained at a position which is the same as or recessed into the inlet aperture at the leading end of the resist supply portion. Therefore, air mixing into the resist and liquid level misdetections can be prevented.

According to the present invention as described above, a resist pipe and a resist coating device are provided in which a liquid level sensor is disposed inside a resist supply portion, and air mixing into the resist, liquid level misdetections and the like can be prevented.

BRIEF DESCRIPTION OF THE DRAWINGS

Exemplary embodiments of the present invention will be described in detail based on the following figures, wherein:

FIG. 5A to FIG. 5C are a perspective view and sectional views showing a resist pipe of a resist coating device relating to a second embodiment of the present invention.

DETAILED DESCRIPTION

Figure 1:
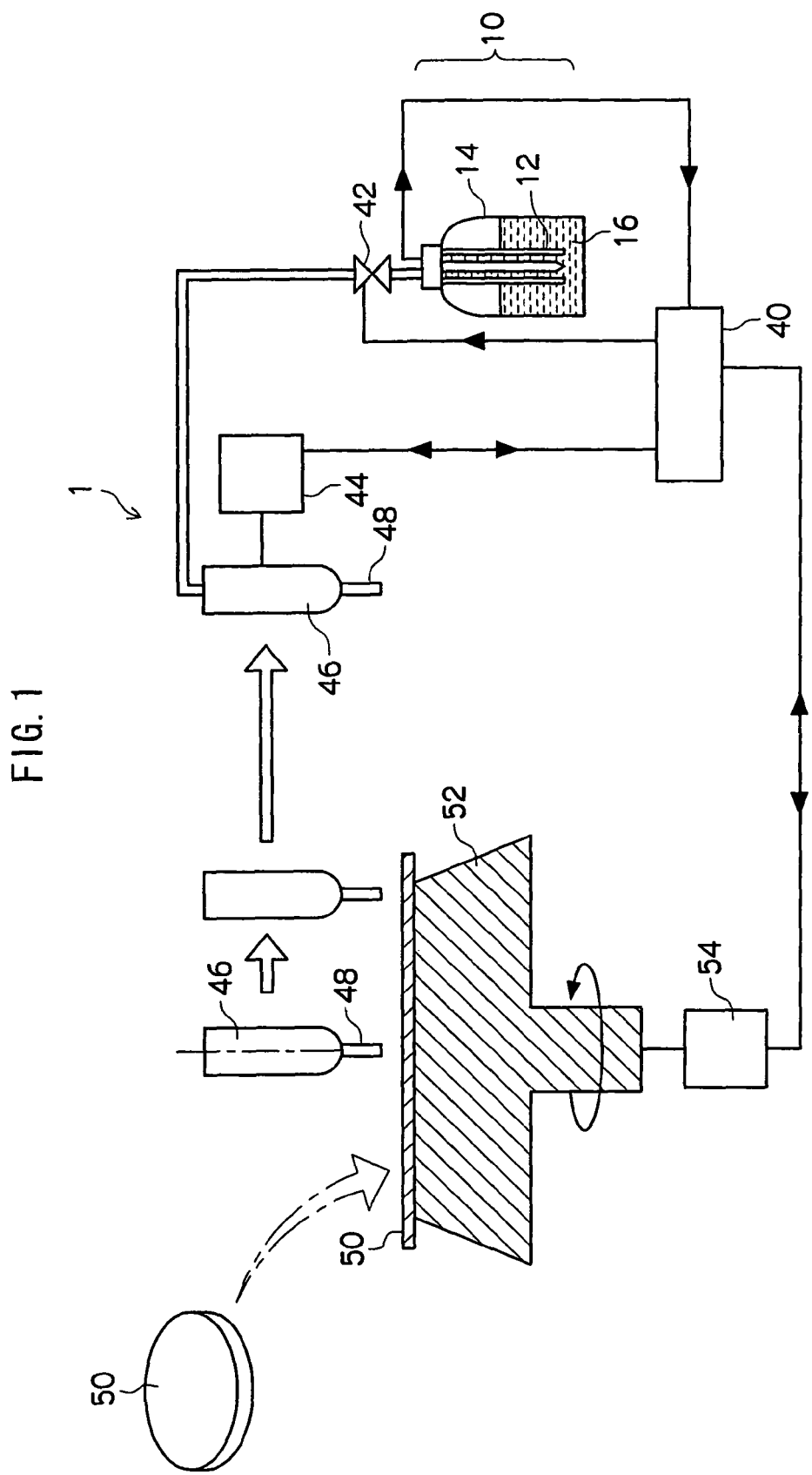
FIG. 1 is a schematic diagram showing a resist coating device relating to the present invention.

An example of a resist coating device equipped with a resist pipe relating to a first embodiment of the present invention is shown in FIG. 1.

As shown in FIG. 1, a resist coating device 1 relating to the first embodiment of the present invention is provided with a chuck 52, a resist supply section 10, a dispenser 46, and a control section 40. The chuck 52 horizontally retains a semiconductor wafer 50 (herebelow referred to simply as the wafer 50), and is turned by a motor 54. The resist supply section 10 is formed with a gallon bottle 14 which contains a resist liquid 16 and a resist supply portion which is inserted into the gallon bottle 14. The dispenser 46 includes a nozzle 48 which drips the resist liquid 16, which is pumped from the resist supply portion with pressure provided from a pump 42, onto the wafer 50 in units of a predetermined amount. The control section 40 implements control of a motor 44, the motor 54 and the pump 42, wherein the motor 44 moves the dispenser 46 from an inner periphery side to an outer periphery side of the wafer 50 and causes the dispenser 46 to withdraw to an outer side of the chuck 52.

First Embodiment

Figure 2A:
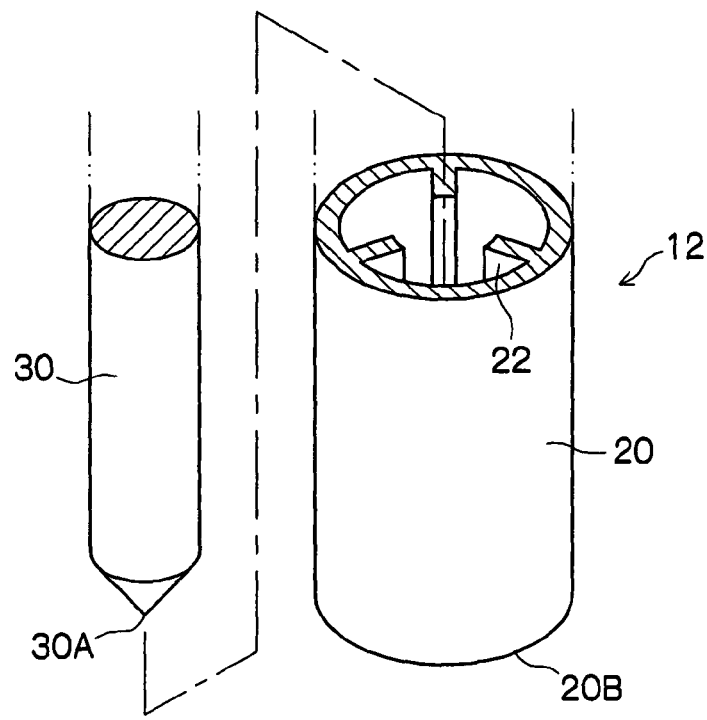
FIG. 2A to FIG. 2C are perspective views and sectional views showing a liquid level sensor portion and a resist supply portion that structures a resist pipe of a resist coating device relating to a first embodiment of the present invention.
Figure 2B:
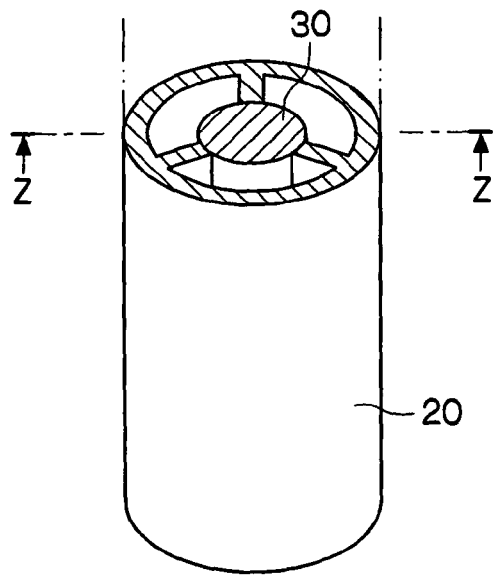
Figure 2C:
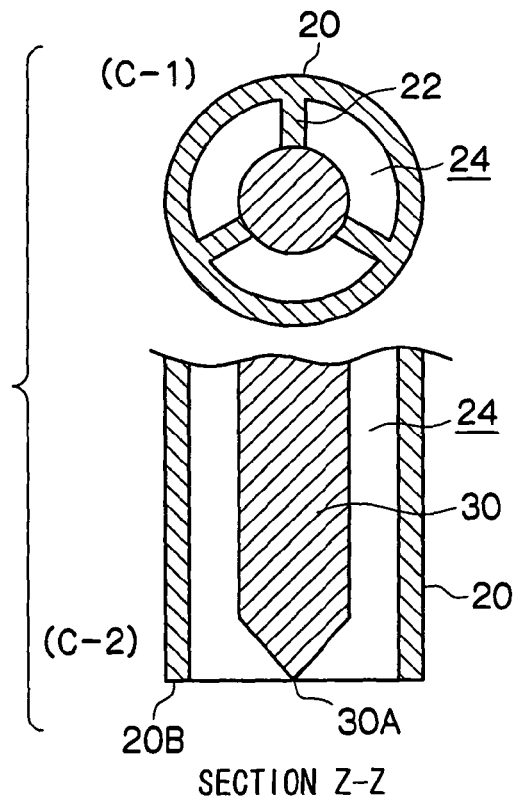

FIG. 2A to FIG. 2C show a resist supply portion and a liquid level sensor portion relating to the first embodiment of the present invention.

As shown in FIG. 2A to FIG. 2C, a circular rod-shaped liquid level sensor portion 30 is inserted into a round pipe-shaped resist supply portion 20, and is supported centrally in cross-section so as not to contact against an inner wall of the resist supply portion 20.

Support portions 22 are provided from three locations at the inner wall of the resist supply portion 20 towards the cross-sectional center. The support portions 22 are provided at equal intervals on the inner wall, and the leading ends thereof are extended to positions at which the circular rod-shaped liquid level sensor portion 30 is nipped by the peripheral surface thereof. Thus, as shown in FIG. 2B, the support portions 22 support the liquid level sensor portion 30 from three directions, gaps 24 are formed between the liquid level sensor portion 30 and the inner wall of the resist supply portion 20, and a space for the resist liquid 16 to pass through is assured. In order to assure a cross-sectional area of the gaps 24, an outer diameter of the resist supply portion 20 is set to about 1.4 times a conventional outer diameter.

As shown in FIG. 2C, which is a section Z-Z of FIG. 2B, the liquid level sensor portion 30 inside the resist supply portion 20 is supported by the support portions 22 such that a sensing portion 30A is in substantially the same horizontal plane as an inlet aperture 20B of the resist supply portion 20.

The sensing portion 30A may be supported by the support portions 22 so as to be at a position recessed from the inlet aperture 20B. That is, it is sufficient that the sensing portion 30A does not protrude from the inlet aperture 20B.

A cable 31, which transmits liquid level detection information from the liquid level sensor portion 30 to the control section 40, extends in a direction opposite to the sensing portion 30A side and is separated from the resist liquid 16, which is drawn up toward the pump 42, between the resist supply portion 20 and the pump 42.

Figure 4:
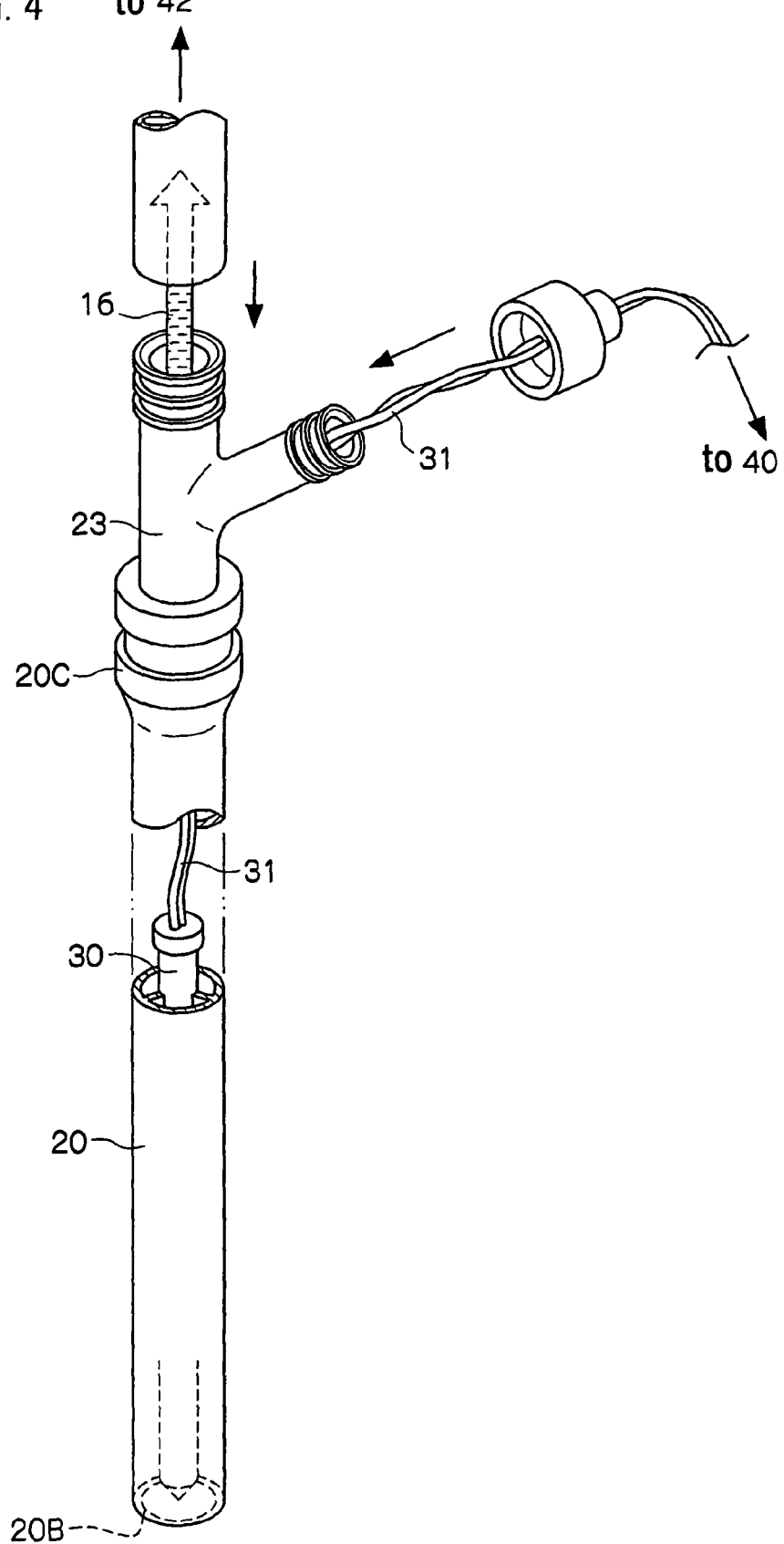
FIG. 4 is a perspective view showing the resist pipe of the resist coating device relating to the first embodiment of the present invention.

Specifically, for example, as shown in FIG. 4, a structure is formed in which the cable 31 and the resist liquid 16 are forked apart using a two-way joint 23 or the like at an arbitrary location between a rear end 20C of the resist supply portion 20 and the pump 42.

Operation of the First Embodiment

FIG. 3A to FIG. 3D show a resist supply section 10 relating to the first embodiment of the present invention.

The resist supply section 10 is formed with the gallon bottle 14 and the resist pipe 12 which is attached to the gallon bottle 14. The resist pipe 12 is structured with the resist supply portion 20 and the liquid level sensor portion 30.

Figure 3A:
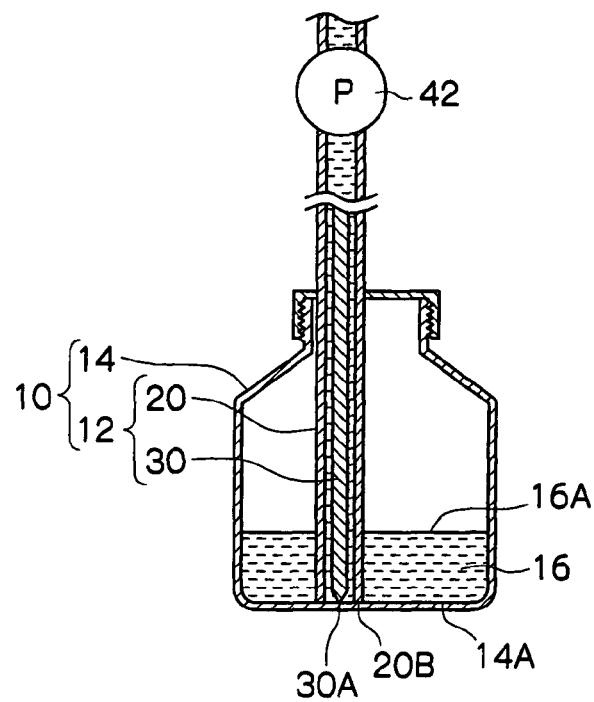
FIG. 3A to FIG. 3D are sectional views showing operation of the resist pipe of the resist coating device relating to the first embodiment of the present invention.
Figure 3B:
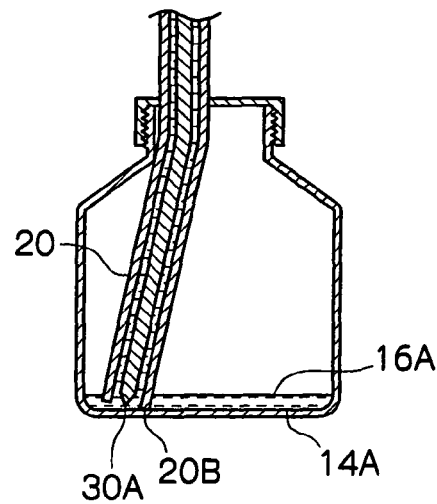

The resist pipe 12 draws up the resist liquid 16 inside the gallon bottle 14 by the pump 42, and supplies the resist liquid 16 to the dispenser 46 by pressurizing. At this time, as shown in FIG. 3A, when the inlet aperture 20B of the resist supply portion 20 reaches a floor 14A of the gallon bottle 14, the resist liquid 16 can be drawn out without problems.

Figure 3C:
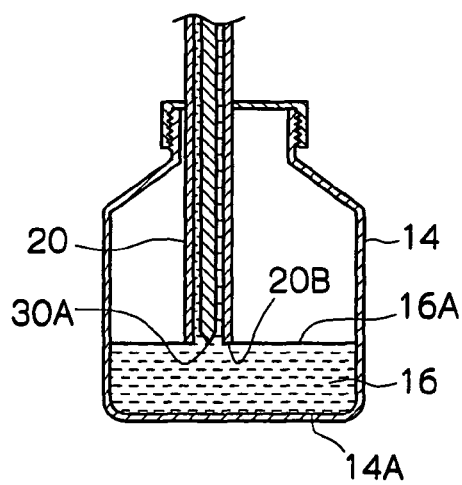

Now, if, for example, the inlet aperture 20B is separated from the floor 14A of the gallon bottle 14 as shown in FIG. 3C, the inlet aperture 20B of the resist supply portion 20 contacts with a liquid level 16A of the resist liquid 16 in a state in which the liquid level 16A is separated from the floor 14A, that is, a state in which a remaining amount of the resist liquid 16 is substantial.

In the situation described above, proper resist dripping amount for the resist coating process may not be obtained and coating failures may occur. However, in the invention of the present application shown in FIG. 3C, the sensing portion 30A of the liquid level sensor portion 30 is always maintained at the same height as the inlet aperture 20B of the resist supply portion 20. Therefore, when the liquid level 16A reaches the inlet aperture 20B, the sensing portion 30A of the liquid level sensor portion 30 senses the liquid level 16A, and air inhalation can be prevented.

Figure 8A:
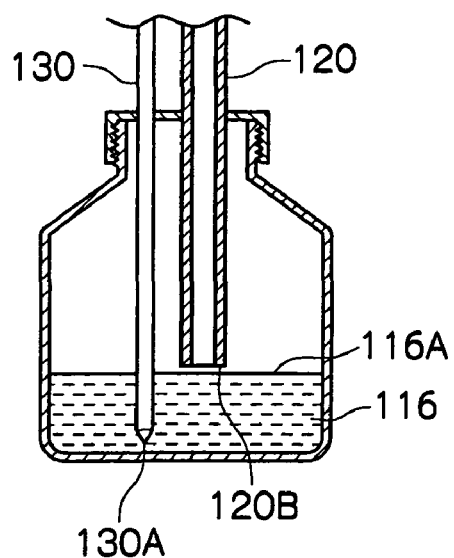
FIG. 8A to FIG. 8D are sectional views showing problems that occur at the conventional resist supply portion.
Figure 8B:
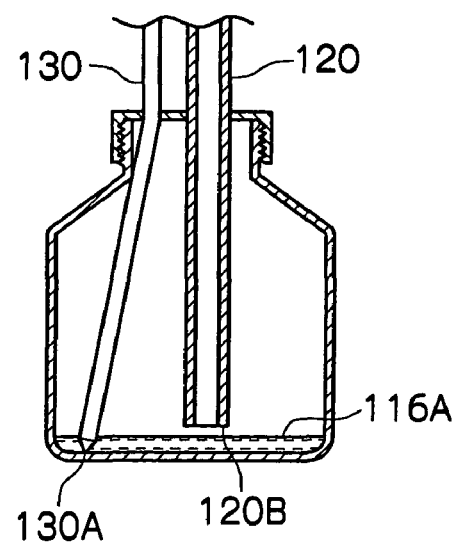
Figure 8C:
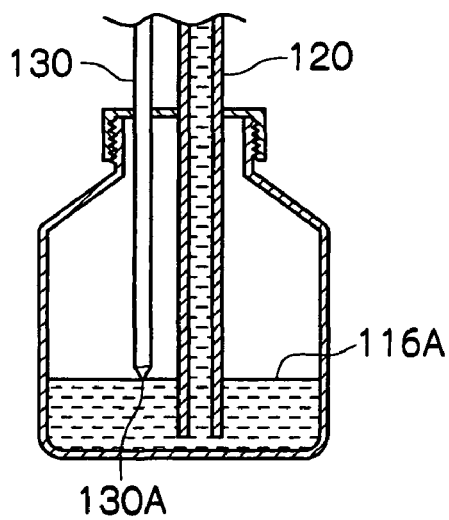
Figure 8D:
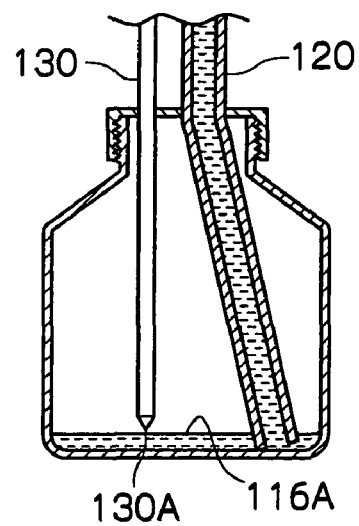

Similarly, in a case in which insertion lengths of the resist supply portion 120 and the liquid level sensor portion 130 into the gallon bottle 14 are different, as in the conventional example illustrated in FIG. 8B and FIG. 8D, the liquid level may not be properly detected. However, in the invention of the present application, because the sensing portion 30A of the liquid level sensor portion 30 is always maintained at the same height as the inlet aperture 20B of the resist supply portion 20, the sensing portion 30A of the liquid level sensor portion 30 can sense the liquid level 16A when the liquid level 16A reaches the inlet aperture 20B.

In the conventional example illustrated in FIG. 8C, the liquid level 116A is misdetected even though a remaining amount of the resist liquid 16 is substantial. Therefore, while air inhalation does not occur, the resist liquid 16 is wasted or necessary man-hours are required to wastefully exchange the wasted resist liquid.

Figure 3D:
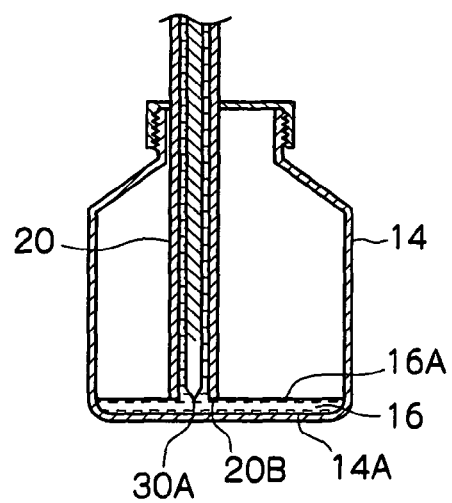

In contrast, in the invention of the present application, because the inlet aperture 20B of the resist supply portion 20 and the sensing portion 30A of the liquid level sensor portion 30 are always disposed at the same height as shown in FIG. 3D, there is no risk of misdetection of the liquid level 16A as long as a remaining amount of the resist liquid 16 is substantial (i.e., as long as the liquid level 16A is high).

Furthermore, in the present embodiment, because the liquid level sensor portion 30 is supported inside the resist supply portion 20, as shown in (C-2) of FIG. 2C, the sensing portion 30A is inherently always disposed at the inner side of the resist supply portion 20.

Therefore, even in the various situations as illustrated in FIG. 3A to FIG. 3D, the sensing portion 30A of the liquid level sensor portion 30 senses the liquid level 16A when the liquid level 16A reaches the inlet aperture 20B, and air inhalation can be prevented.

Alternatively, even in a case in which the sensing portion 30A is disposed not in the same plane as the inlet aperture 20B but at a position recessed (i.e. higher) relative to the inlet aperture 20B, the liquid level 16A can be sensed when the resist supply portion 20 separates from the liquid level 16A and air is drawn in (a state in which air is chewed in). Specifically, when the resist liquid 16 has been consumed and the liquid level 16A falls and separates from the inlet aperture 20B, the support by atmospheric pressure, which has been supporting the resist liquid 16 inside the resist supply portion 20, is lost and the resist liquid 16 is discharged through the inlet aperture 20B. In this manner, the sensing portion 30A is exposed to the atmosphere, and the liquid level falling of the resist liquid 16 can be detected.

Second Embodiment

Figure 5A:
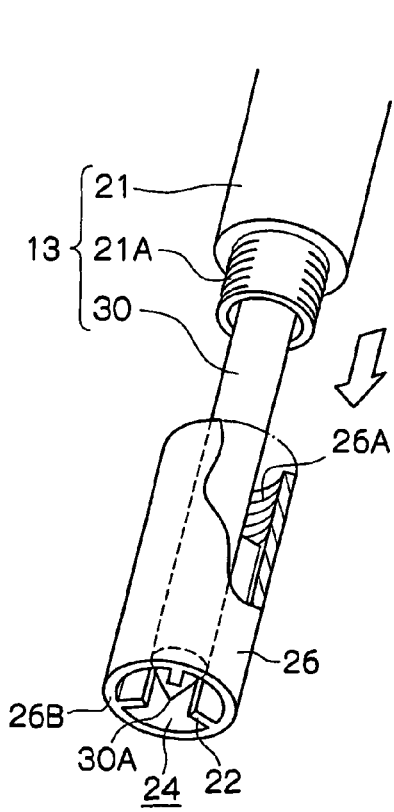
Figure 5A:
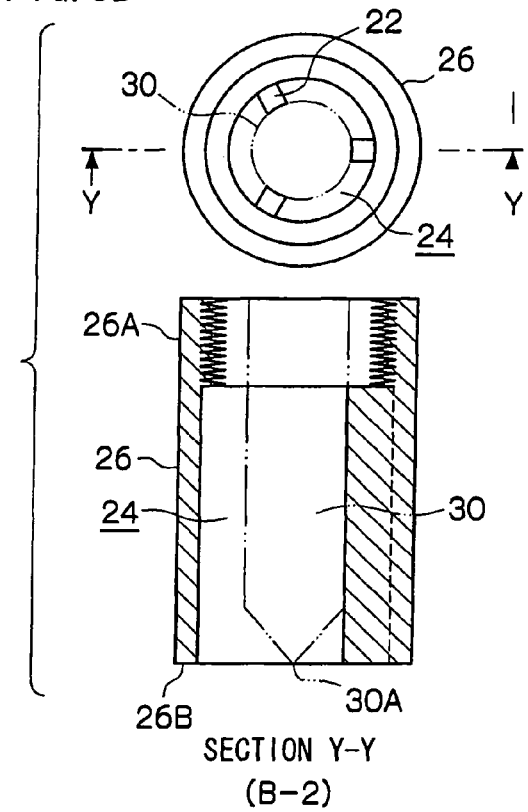
Figure 5C:
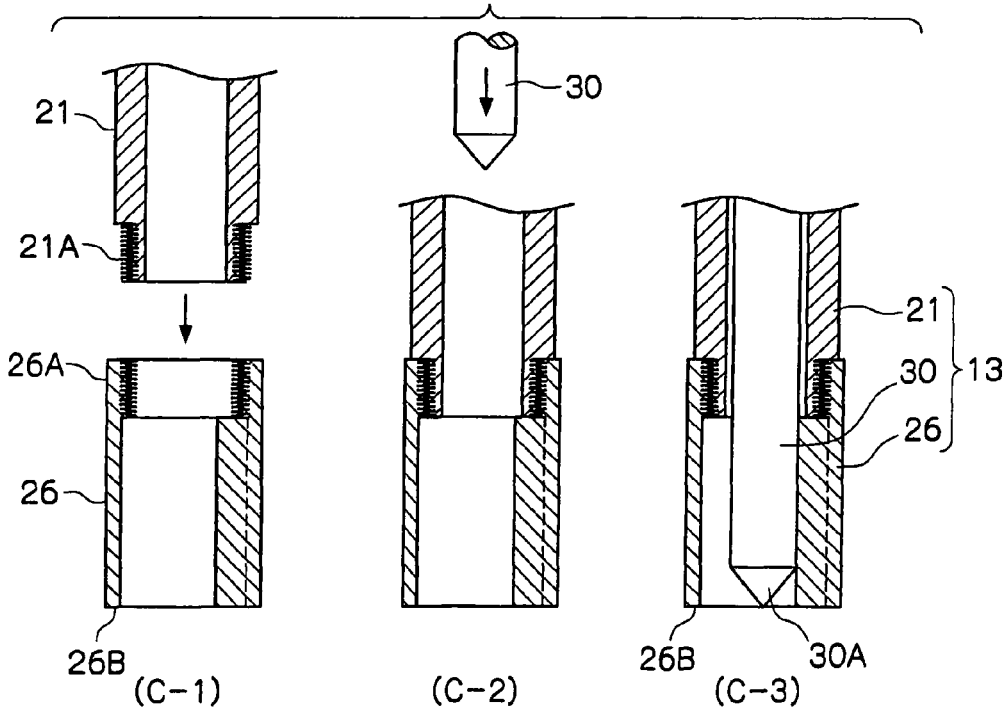

FIG. 5A to FIG. 5C show a resist supply portion and a liquid level sensor portion relating to a second embodiment of the present invention.

As shown in FIG. 5A, a male threaded portion 21 A is provided at a leading end of a round pipe-shaped resist supply portion 21, and threadingly fits into a cylindrical joint 26, which is provided with a female threaded portion 26A that screws together with the male threaded portion 21A.

The support portions 22 are provided from three locations at an inner wall of the joint 26 toward the cross-sectional center, as shown in FIG. 5B. The support portions 22 are provided at equal intervals on the inner wall, and nip the circular rod-shaped liquid level sensor portion 30 by the peripheral surface thereof.

The circular rod-shaped liquid level sensor portion 30 is inserted into the joint 26 and is supported centrally in cross-section so as not to contact against the inner wall of the joint 26, and the gaps 24 are formed between the liquid level sensor portion 30 and the inner wall of the joint 26.

As shown in (B-2) of FIG. 5B, which is a section Y-Y of (B-1) of FIG. 5B, the liquid level sensor portion 30 inside the joint 26 is supported by the support portions 22 such that the sensing portion 30A is in substantially the same horizontal plane as an inlet aperture 26B of the joint 26. The liquid level sensor portion 30 provided extending from the interior of the resist supply portion 21 is disposed coaxially with the joint 26 and the resist supply portion 21, as shown by the chain double-dashed lines in FIG. 5B.

As shown in (C-1) of FIG. 5C, the male threaded portion 21A provided at the leading end of the resist supply portion 21 is threadingly inserted into the female threaded portion 26A of the joint 26. Then, as shown in (C-2) of FIG. 5C, the liquid level sensor portion 30 is inserted from the resist supply portion 21 side. The liquid level sensor portion 30 is supported by the support portions 22 provided at the inner wall of the joint 26 so as not to contact against the inner wall of the joint 26.

Here, similar to the first embodiment, the cable 31 and the resist liquid 16 are forked apart using the two-way joint 23 or the like, as shown in FIG. 4.

Finally, as shown in (C-3) of FIG. 5C, the position of the liquid level sensor portion 30 is adjusted such that the sensing portion 30A of the liquid level sensor portion 30 is in the same plane as the inlet aperture 26B of the joint 26. In this way, when set in the gallon bottle 14, the sensing portion 30A of the liquid level sensor portion 30 is always at the same height as the inlet aperture 26B of the joint 26. Therefore, misdetection, air mixing into the resist liquid 16 and the like can be prevented, as in the first embodiment.

Moreover, in the present embodiment, the liquid level sensor portion 30 is also supported inside the joint 26, therefore, even in the various situations as illustrated in FIG. 3A to FIG. 3D, the sensing portion 30A of the liquid level sensor portion 30 detects the liquid level 16A when the liquid level 16A reaches the inlet aperture 26B, and air inhalation can be prevented, the same as in the first embodiment.

Furthermore, as in the first embodiment, in a case in which the sensing portion 30A is disposed not in the same plane as the inlet aperture 26B but at a position recessed (i.e. higher) relative to the inlet aperture 26B, the liquid level 16A can be detected when the resist supply portion 20 separates from the liquid level 16A and air is drawn in (the state in which air is chewed in).

Formation of Semiconductor Chip

FIG. 6A to FIG. 6H show an example of forming steps of a semiconductor chip using a resist coating device that includes a resist supply portion relating to the present invention.

In preceding stages, a silicon monocrystal is first sliced into slices of around 0.5 mm with a diamond blade or the like, the individual slices are separated into wafers, and thus the wafer 50 is formed. Then, the machined wafer 50 is arranged in a furnace and heat treatment is performed in the furnace at around 1000° C. with oxygen and silicon gas being blown in, so as to form an oxide film 50A at a surface of the wafer 50. After composition and machining, the oxide film 50A will ultimately form a circuit.

Then, using the resist coating device 1 as shown in FIG. 1, the resist liquid 16 is coated to the wafer 50 on the chuck 52. Specifically, the wafer 50 at which the oxide film 50A has been formed is rotated at high speed by the chuck 52, the resist liquid 16 is dripped onto the surface of the wafer 50 (i.e., the oxide film 50A) while being uniformly coated and being dried. The resist liquid 16 is dried and a resist film 17 is formed on the wafer 50 (the oxide film 50A).

Here, when the resist liquid 16 is being supplied from the gallon bottle 14 to the dispenser 46 as described above, if the resist supply portion 20 (or 21) draws in air, the resist liquid 16 cannot be measured accurately, and problems such as failures in forming the resist film 17 and suchlike are conceivable. However, according to the present invention, air mixing into the resist liquid 16 can be avoided.

Figure 6A:
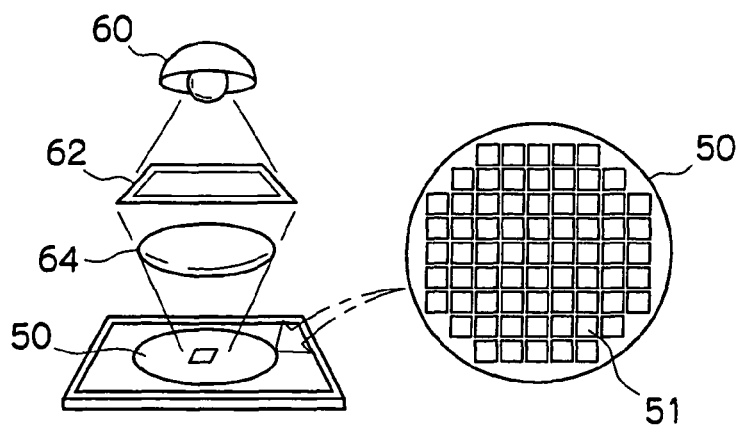
FIG. 6A to FIG. 6H are drawings showing forming steps of a semiconductor using the resist coating device relating to the present invention.

Then, using an exposure device as shown in FIG. 6A, a circuit pattern recorded in a mask 62 is projected and exposed onto the wafer 50. Light which is emitted from a lamp 60 and passes through the mask 62 is imaged onto the wafer 50 (i.e., the oxide film 50A and resist film 17) by a lens 64, and exposure is performed. The circuit pattern of the mask 62 corresponds to a chip 51 set on the wafer 50. The exposure is repeated by the times corresponding to the number of the chips 51 on the single wafer 50.

Figure 6B:
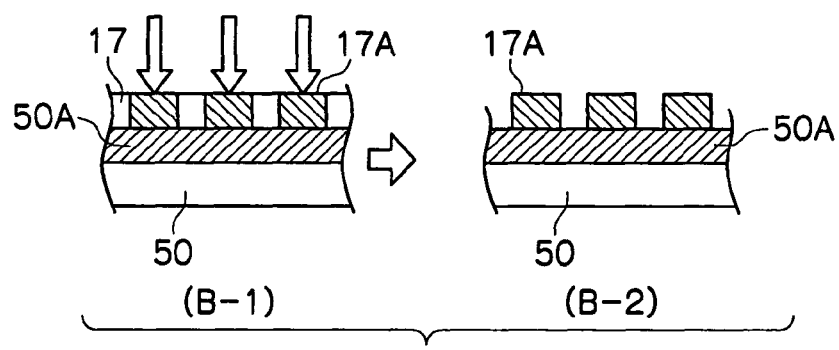
Figure 6C:
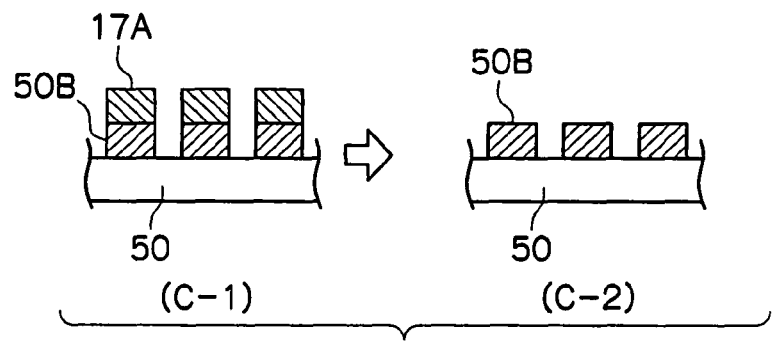

Thus, as shown in (B-1) of FIG. 6B, a resist mask 17A is formed on the exposed resist film 17, in accordance with the circuit pattern recorded in the mask 62. Development is performed with a developing fluid that dissolves the resist film 17, whereby, in a case of a negative resist, the unexposed portions of the resist film 17 are removed leaving only the resist mask 17A (or, in a case of a positive resist, only the exposed portions of the resist film 17 are removed).

Next, the wafer 50 at which the resist mask 17A has been formed is etched with a liquid or gas that dissolves the oxide film 50A, and portions of the oxide film 50A that are not masked by the resist mask 17A are removed. Thus, as shown in (C-1) of FIG. 6C, a pattern 50B of the oxide film 50A that corresponds to the circuit pattern recorded in the mask 62 is formed on the wafer 50. Then, the resist mask 17A is removed by a stronger developing fluid and thus, as shown in (C-2) of FIG. 6C, only the pattern 50B of the oxide film 50A is formed on the wafer 50.

Figure 6D:
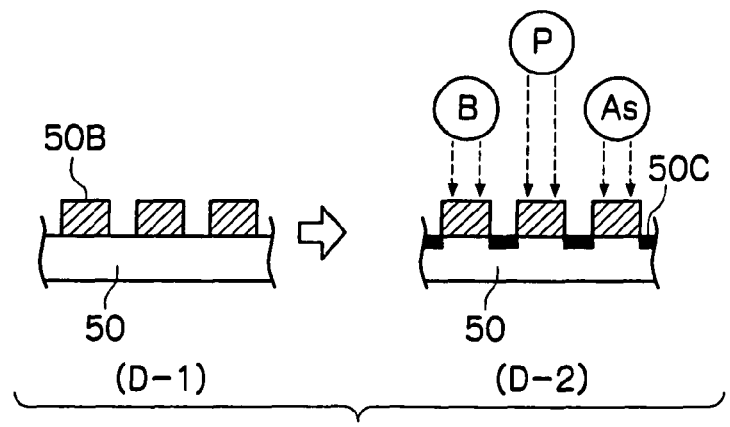

Next, as shown in (D-1) of FIG. 6D, the wafer 50 at which the pattern 50B has been formed is subjected to heat treatment in an atmosphere of boron (B), phosphorus (P), arsenic (As) or the like, in a temperature-adjusted furnace. Thus, impurities of boron (B), phosphorus (P), arsenic (As) or the like are introduced (i.e., doping) into a surface 50C of silicon regions of the wafer 50 at which the pattern 50B has not been formed, and elements such as transistors, diodes and the like are formed at the surface 50C of the wafer 50. Further heat treatment called as annealing is applied such that the microscopic quantities of the impurities of boron (B), phosphorus (P), arsenic (As) or the like function properly.

In order to form various elements on the wafer 50, the above-described steps of FIG. 6A to FIG. 6D are repeated from ten or so times to a few dozen times in accordance with requirements, with the mask 62 being exchanged. In this manner, formation of elements corresponding to complex patterns is implemented.

Figure 6E:
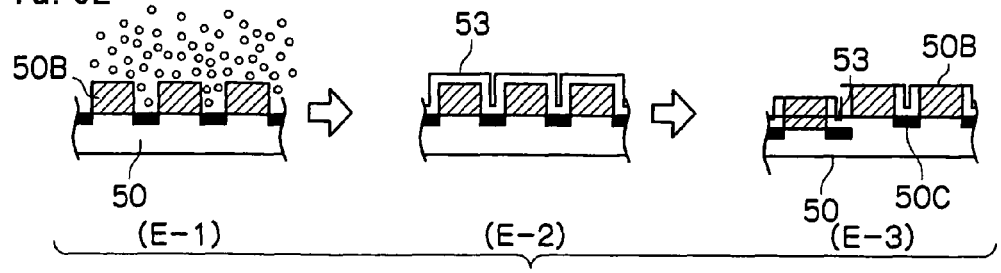

Then, in order to connect the elements formed in the above-described steps, aluminum is vacuum-deposited over the overall wafer 50 as shown in (E-1) of FIG. 6E, and an aluminum layer 53 is formed. Next, the portions of the aluminum layer 53 that are not required are scraped away as shown in (E-3) of FIG. 6E, and wiring is completed. Copper or the like may be employed instead of aluminum.

Figure 6F:
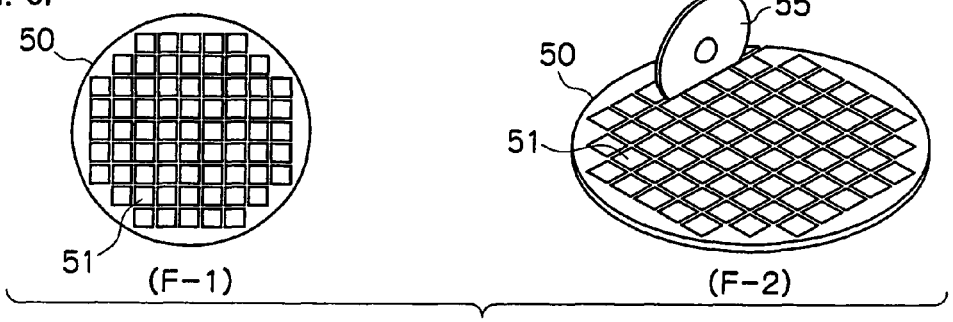

Then, as shown in (F-1) of FIG. 6F, the chips 51 formed on the wafer 50 are individually cut apart (i.e., dicing) with a diamond cutter 55, as shown in (F-2) of FIG. 6F, or the like.

Figure 6G:
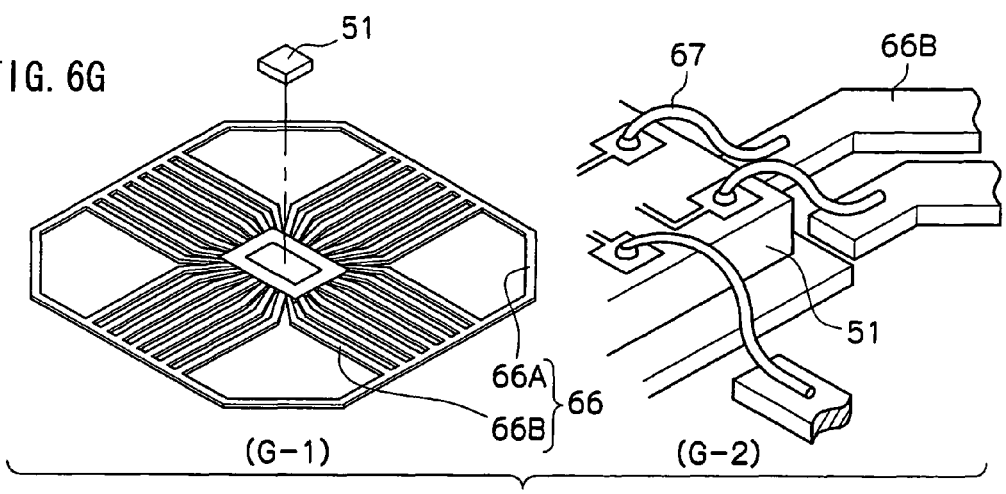
Figure 6H:
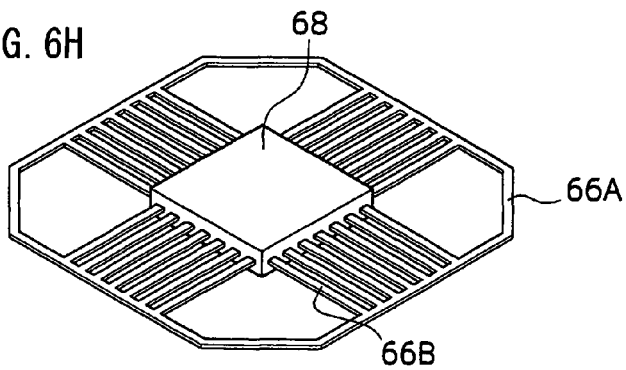
Figure 7:
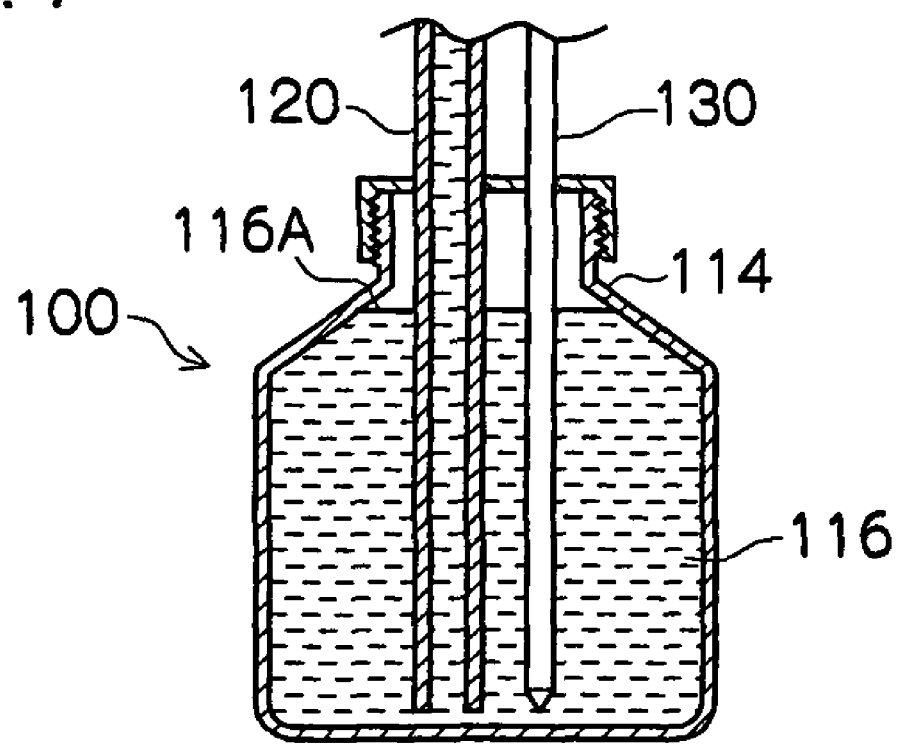
FIG. 7 is a sectional view showing a conventional resist supply portion.

Then, as shown in (G-1) of FIG. 6G, the chip 51 that has been cut apart by dicing is wire-bounded to a lead frame 66. Specifically, as shown in the enlarged view (G-2) of FIG. 6G, the chip 51 and lead portions 66B of the lead frame 66 are wire-bounded (i.e., dicing) with wires 67 of gold or the like.

Next, the chip 51 that has been wire-bounded to the lead frame 66 is checked, and if there are no problems, is sealed (i.e., molding) in a package 68 of synthetic resin, ceramic or the like. Finally, frame portions 66A of the lead frame 66 are cut apart, and forms of the lead portions 66B are arranged for substrate mounting.

In the semiconductor chip forming process using the resist coating device 1 including the resist supply section 10 relating to the present invention as described above, air mixing into the resist liquid 16 and liquid level misdetections can be avoided in the step of coating the resist liquid 16 to the wafer 50. Therefore, occurrences of problems with the resist film 17 and stoppages of the apparatus can be suppressed, and the semiconductor chip formation can be performed with high yield.

Conclusion

Embodiments of the present invention have been described hereabove, but the present invention is not to be limited in any way by the embodiments described above. Obviously, the present invention can be embodied in numerous aspects without departing from the scope of the present invention.

Specifically, in the embodiment described above, the liquid level sensor portion 30 is supported by the support portions 22 from three directions. However, instead of the support portions 22, support portions may be provided extending from the peripheral surface of the liquid level sensor portion 30 to the inner wall of the resist supply portion 20 or the joint 26. Alternatively, one or a plurality of spiral supporting portions may be provided at the inner wall of the resist supply portion 20 or the joint 26.

Furthermore, the present invention is also applicable to a structure for drawing in and supplying a liquid, even the liquid is other than a photoresist liquid. Moreover, the shape and the like of the container are not limited to a gallon bottle and there is no objection to use other shapes.

What is claimed is:

1. A resist pipe, comprising:
   a resist supply portion inserted into a container accommodating a resist liquid and configured to draw in the resist liquid, the resist supply portion having an inlet aperture and an inner wall; and
   support portions provided at the inner wall of the resist supply portion, supporting a peripheral surface of a rod-shaped liquid level sensor portion from at least three directions, and setting a sensing portion at a leading end of the rod-shaped liquid level sensor portion in substantially the same plane as the inlet aperture, the support portions being provided at equal intervals at the inner wall of the resist supply portion, and gaps are formed between the rod-shaped liquid level sensor portion and the inner wall of the resist supply portion so as to ensure a space for the resist liquid to pass through.

2. A resist coating device comprising the resist pipe of claim 1.

3. The resist pipe of claim 1, wherein the inlet aperture is disposed at a bottom most location of the resist pipe.

4. The resist pipe of claim 1, wherein the resist liquid enters into the resist pipe directly from the container via the inlet aperture.

5. The resist pipe of claim 1, wherein the resist liquid is drawn out of the container via the gaps.

6. The resist pipe of claim 1, wherein the rod-shaped liquid level sensor portion is solid.

7. The resist pipe of claim 1, wherein the rod-shaped liquid level sensor portion is inserted into and disposed within the resist supply portion.

8. The resist pipe of claim 1, wherein an end of the rod-shaped liquid level sensor portion that is inserted into the resist liquid is pointed.

* * * * *